(12) United States Patent
Tonegawa et al.

(10) Patent No.: US 6,711,395 B1
(45) Date of Patent: Mar. 23, 2004

(54) RECEIVING MODULE AND RECEIVER

(75) Inventors: Ken Tonegawa, Otsu (JP); Yoshihiro Yoshimoto, Takefu (JP); Norihiro Shimada, Shiga-ken (JP); Jun Sasaki, Takefu (JP); Tomoya Bando, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 218 days.

(21) Appl. No.: 09/694,423

(22) Filed: Oct. 23, 2000

(30) Foreign Application Priority Data

Oct. 21, 1999 (JP) ............................. 11-299752

(51) Int. Cl.$^7$ ................................. H04B 1/26
(52) U.S. Cl. ................. 455/313; 455/323; 455/326; 455/333; 455/334
(58) Field of Search ................. 455/323, 324, 455/325, 326, 327, 328, 329, 330, 333, 292, 293, 313, 318, 319, 334, 130, 131, 180.4, 190.1; 327/113; 323/315; 330/252

(56) References Cited

U.S. PATENT DOCUMENTS

| | | | |
|---|---|---|---|
| 4,491,976 A | * 1/1985 | Saitoh et al. | ............... 455/315 |
| 5,649,288 A | 7/1997 | De Loe, Jr. et al. | ....... 455/33.1 |
| 5,930,696 A | 7/1999 | Tzuang et al. | ............... 455/311 |
| 6,026,286 A | * 2/2000 | Long | ........................... 455/327 |
| 6,157,822 A | * 12/2000 | Bastani et al. | .............. 455/323 |
| 6,438,365 B1 | * 8/2002 | Balteanu | ..................... 455/326 |

FOREIGN PATENT DOCUMENTS

| | | |
|---|---|---|
| EP | 0595346 | 5/1994 |
| EP | 0736978 | 10/1996 |
| JP | 4-130842 | 5/1992 |
| JP | 10-285066 | 10/1998 |
| JP | 11-8564 | 1/1999 |

* cited by examiner

Primary Examiner—Duc M. Nguyen
(74) Attorney, Agent, or Firm—Keating & Bennett, LLP

(57) ABSTRACT

A receiving module and a TDMA-system receiver are adapted to broadening of bands of received signals and low frequencies of intermediate frequency signals. These apparatuses can be made compact and contribute to cost reduction. The receiving module is constituted of a low-noise amplifier, a high frequency LC filter, a Gilbert-cell type mixer, and baluns. A signal received by an antenna is amplified by the low-noise amplifier and is passed through the LC filter. After that, the signal is mixed with a local oscillation signal by the Gilbert-cell type mixer to be converted into an intermediate frequency signal.

12 Claims, 4 Drawing Sheets

RECEIVING MODULE AND RECEIVER

BACKGROUND OF THE INVENTION

1. Field of the Invention

The present invention relates to receiving modules and receivers. More particularly, the invention relates to receiving modules and receivers using Gilbert-cell type mixers.

2. Description of the Related Art

Recently, the Time Division Multiple Access (TDMA) wireless system has been adopted in the Japanese Personal Digital Cellular (PDC) system and in the European Global System for Mobile Communication (GSM). The Code Division Multiple Access (CDMA) wireless system has been adopted in the North American Interim Standard (IS)-95. The TDMA system and the CDMA system are rapidly spreading as wireless communication apparatuses and communication costs are becoming cheaper owing to the efforts of apparatus vendors. A receiver that can be incorporated in both the TDMA wireless system and the CDMA wireless system will be described below.

FIG. 6 shows a block diagram of a conventional receiver. A signal RF received by an antenna 1 is amplified by a low-noise amplifier 2. After this, the signal passes through a high frequency filter 3 and is mixed with a local oscillation signal LO by a mixer 4 to be converted into an intermediate frequency signal IF. The intermediate frequency signal IF passes through an IF band filter 5. Then, a limiter-amplifier 6 amplifies the intermediate frequency signal IF and detects the level of the received signal and provides an output to a demodulator DEM.

FIG. 7 is a circuit diagram of a single-end type mixer that may be used as the mixer 4 in the conventional receiver. A single-end type mixer 50 is constituted of a transistor Q50, capacitors C50 and C51, and a resistor R50. A received signal terminal PRF and a local oscillation signal terminal PLO are connected to the base of the transistor Q50, and an intermediate frequency signal terminal PIF is connected to the collector thereof via the capacitor C50. A control terminal V50 is connected to the collector of the transistor Q50, and the emitter of the transistor Q50 is connected to a ground via the resistor R50 and the capacitor C51. The received signal RF and the local oscillation signal LO are input from the received signal terminal PRF and the local oscillation signal terminal PLO, respectively, and the intermediate frequency signal IF is obtained from the intermediate frequency signal terminal PIF.

When the single-end type mixer is used, isolation between the local oscillation signal terminal and the received signal terminal is not sufficient. In addition, an even-order harmonic occurs due to the non-linear characteristics of the mixer. Thus, it is necessary to simultaneously attenuate a local oscillation signal and a half-image signal (a signal having a frequency that is the sum of the local oscillator frequency plus half the intermediate frequency) causing the even-order harmonic. However, in the PDC system, a received signal is divided into two band signals to be used in a single system. In this case, when the intermediate frequency signal is low, the half-image signal on the high frequency side superimposes itself on the received signal on the low frequency side. As a result, it is impossible to simultaneously attenuate both the local oscillation signal and the half-image signal with a single high frequency filter having a wide pass band. Thus, as shown in FIG. 8, it is necessary to use a pair of surface acoustic wave filters 3a and 3b having steep characteristics adapted to the low and high frequency bands as the high frequency filter between the low-noise amplifier 2 and the mixer 4, and the filters are switched by a selecting switch 7.

For example, in the PDC system a received signal is divided into two band signals so as to use the low frequency band ranging from 810 to 843 MHZ and the high frequency band ranging from 870 to 885 MHZ. When a signal RF of the high-frequency band 885 MHZ is received, the intermediate frequency signal IF is 130 MHZ. In this case, when a local oscillation signal LO of 755 MHZ is used, the half-image signal of 820 MHZ is a disturbance (interference) signal, and superimposes itself on the low-frequency band ranging from 810 to 843 MHZ. As a result, it is impossible to simultaneously attenuate the local oscillation signal of 755 MHZ and the half-image signal of 820 MHZ with the single high frequency filter having the broad pass band ranging from 810 to 885 MHZ. Accordingly, it is necessary to provide two surface acoustic wave filters having the pass bands ranging from 810 to 843 MHZ and 870 to 885 MHZ with the steep characteristics. A select switch is used such that the surface acoustic wave filter having the pass band ranging from 810 to 843 MHZ is selected when a low-frequency side signal is received, and the surface acoustic wave filter having the pass band ranging from 870 to 885 MHZ is selected when a high-frequency side signal is received.

In the conventional receiver, however, since the single-end mixer is used, with the dividing of received signal frequency bands and the lowering of the frequencies of intermediate frequency signals, it is necessary to use a high frequency filter having steeper characteristics. However, it is impossible to have such steeper characteristics even by using surface acoustic wave filters and dielectric filters having good characteristics.

In addition, even if a high frequency filter having such steeper characteristics can be obtained, a select switch is necessary, with the result that the size of the receiver increases.

SUMMARY OF THE INVENTION

In order to solve the above problems, the present invention provides a receiving module and a receiver that can be adapted to dividing the bands of received signals and lowering of the frequencies of intermediate frequency signals, in which the sizes and costs of the apparatuses can be reduced.

According to a first aspect of the present invention, there is provided a receiving module including a low-noise amplifier amplifying a signal received by an antenna and a mixer mixing the amplified signal with a local oscillation signal to convert the received signal into an intermediate frequency signal. In this receiving module, the mixer is a Gilbert-cell type mixer.

In addition, the receiving module may further include a multi-layer substrate formed by laminating a plurality of ceramic sheet layers to integrate the low-noise amplifier and the mixer.

According to a second aspect of the present invention, there is provided a receiver including an antenna, a demodulator, a local oscillator, and the above receiving module.

In the receiving module of the present invention, since the Gilbert-cell type mixer is used, sufficient isolation between the terminals can be obtained, and even-order harmonics can be suppressed so as to avoid generating half-image signals.

In the receiver according to the present invention, since the compact and low-cost receiving module is incorporated, the size and production cost of the receiver can be reduced.

Other features and advantages of the invention will be understood from the following detailed description of embodiments thereof.

DESCRIPTION OF EMBODIMENTS OF THE INVENTION

Figure 1:
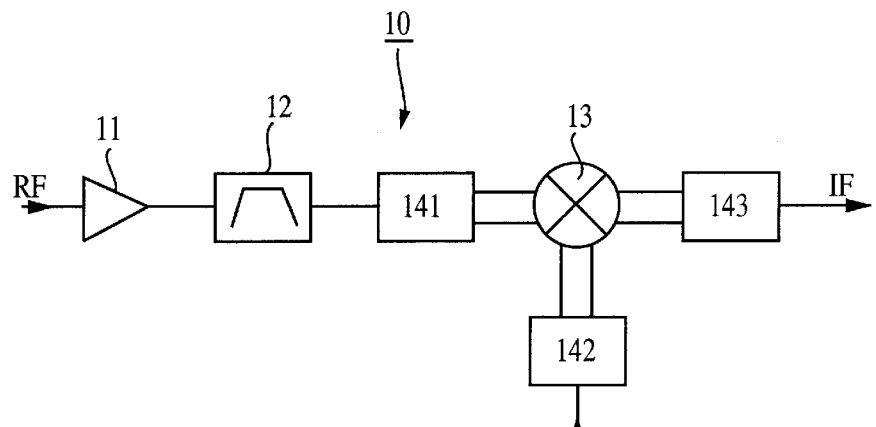
FIG. 1 is a block diagram of a receiving module according to a first embodiment of the present invention.

Referring to the drawings, in which like references indicate like elements and parts, a description will be given of embodiments of the present invention.

FIG. 1 is a block diagram of a receiving module according to a first embodiment of the present invention. A receiving module 10 is constituted of a low-noise amplifier 11, a high frequency LC filter 12, a Gilbert-cell type mixer 13, and baluns 141 to 143.

A signal RF received by an antenna (not shown) is amplified by the low-noise amplifier 11. After passing through the LC filter 12 and the balun 141, the signal RF is input to the Gilbert-cell type mixer 13 to be mixed with a local oscillation signal LO input to the Gilbert-cell type mixer 13 via the balun 142. Then, an intermediate frequency signal IF obtained as the result of conversion by the Gilbert-cell type mixer 13 is output via the balun 143.

Figure 2:
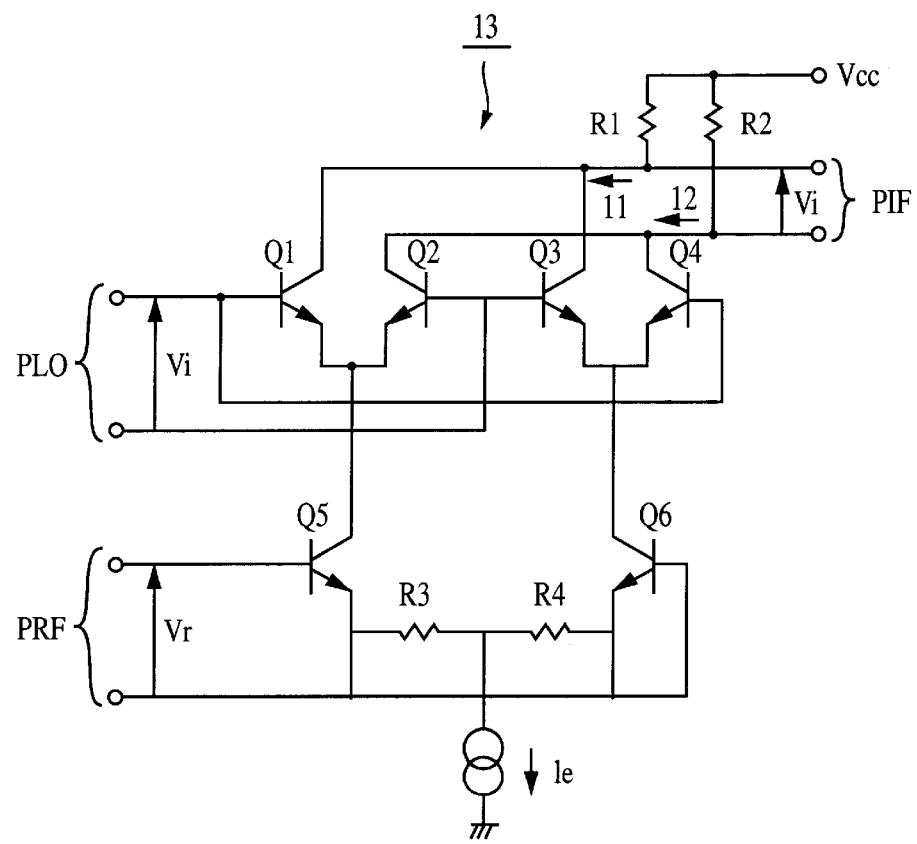
FIG. 2 is a circuit diagram of a Gilbert-cell type mixer constituting the receiving module shown in FIG. 1.

FIG. 2 is a circuit diagram of the Gilbert-cell type mixer 13 constituting the receiving module shown in FIG. 1. The Gilbert-cell type mixer 13 is constituted of six transistors Q1 to Q6 and four resistors R1 to R4.

The bases of the transistors Q1 and Q4, and the bases of the transistors Q2 and Q3 are connected to local oscillation signal terminals PLO. The collectors of the transistors Q1 and Q3, and the collectors of the transistors Q2 and Q4 are connected to intermediate frequency signal terminals PIF. The base of the transistor Q5 and the base of the transistor Q6 are connected to received signal terminals PRF. In addition, the collectors of the transistors Q1 and Q3, and the collectors of the transistors Q2 and Q4 are connected to a control terminal Vcc via resistors R1 and R2, and the emitters of the transistors Q5 and Q6 are connected to a ground via resistors R3 and R4.

In the above arrangement, isolation in the direction from the received signal terminal PRF to the local oscillation signal terminal PLO is obtained by isolation obtained between the emitters of the transistors Q1 to Q4 and the bases thereof. Isolation in the direction from the local oscillation signal terminal PLO to the received signal terminal PRF is obtained by isolation obtained between the collectors of the transistors Q5 and Q6 and the bases thereof.

The sum of the collector currents 11 of the transistors Q1 and Q3 and the collector currents 12 of the transistors Q2 and Q4 is equal to a common emitter current Ie of the transistors Q5 and Q6. When a positive voltage V1 is applied to the local oscillation signal terminal PLO, the transistors Q1 and Q4 are turned on, while the transistors Q2 and Q3 are turned off, in the differential amplification circuits of the transistors Q3 and Q4.

In this case, when the voltage Vr of the received signal terminal PRF is positive, the collector currents 12 flow from the collectors of the transistors Q4 and Q6 to the emitters thereof Since the common emitter current Ie is equal to the sum of the collector currents 11 and 12, the collector current 11 is smaller than the collector current 12, with the result that a voltage Vi is generated in the intermediate frequency signal terminal PIF. The voltage Vi of the intermediate frequency signal terminal PIF is proportional to the voltage Vr of the received signal terminal PRF.

Meanwhile, when the voltage Vr of the received signal terminal PRF is negative, the collector current II flows from the collectors of the transistors Q1 and Q5 to the emitters thereof and the collector current 11 is greater than the collector current 12. As a result, the polarity of the voltage Vi of the intermediate frequency signal PIF is reversed.

When the voltage V1 of the local oscillation signal terminal PLO is negative, the transistors Q1 and Q4 are turned off, while the transistors Q2 and Q3 are turned on. Thus, the polarity of the voltage Vi of the intermediate frequency signal PIF is the reverse of that obtained when the voltage Vr of the received signal terminal PRF is positive.

When the voltage V1 of the local oscillation signal terminal PLO is not generated, or when the voltage Vr of the received signal terminal PRF is not generated, the collector current 11 is equal to the collector current 12. In this case, the voltage Vi of the intermediate frequency signal PIF is not generated.

In addition, when voltage amplitude given to the voltage V1 of the local oscillation signal terminal PLO is large enough to turn on/off the transistors Q1 to Q4, the voltage Vr of the received signal terminal PRF is output as the voltage Vi of the intermediate frequency signal PIF by the switching between negative/positive sides. When the voltage Vr of the received signal terminal PRF is constant, the voltage Vi of the intermediate frequency signal PIF is proportionate to the voltage V1 of the local oscillation signal terminal PLO.

With the operations above, the voltage Vi of the intermediate frequency signal PIF shows a result obtained by multiplying a received signal RF by a local oscillation signal LO. In this case, when the frequency of the received signal RF is denoted by the symbol fr and the frequency of the local oscillation signal LO is denoted by the symbol fl, a frequency as the result of fr ±fl occurs in the intermediate frequency signal IF as an output, and at the same time, odd-order harmonics such as fr ±3fl and fr ±5fl occur.

Figure 3:
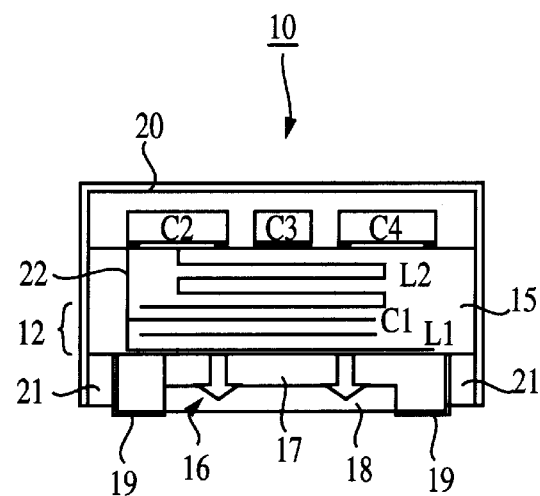
FIG. 3 is a sectional view of the receiving module shown in FIG. 1.

FIG. 3 is a sectional view of the receiving module shown in FIG. 1. FIG. 3 shows only a specific sectional view of the receiving module 10, and not all of the circuit constituents shown in FIG. 1 are shown in the figure.

The receiving module 10 includes a multi-layer substrate 15 formed by laminating a plurality of ceramic sheet layers (not shown) including main components such as barium oxide, aluminum oxide, and silica. On the bottom surface of the multi-layer substrate 15 is formed a cavity 16, in which a SiIC 17 containing a low-noise amplifier 11 and a Gilbert-cell type mixer 13 is disposed in the form of a bare chip. The cavity 16 is sealed by resin 18.

On the relatively lower part of the multi-layer substrate 15, an inductor L1 and a capacitor C1 constituting an LC filter 12 are disposed. In addition, on the relatively upper part thereof, an inductor L2 constituting a balun 141 is disposed.

From the lower parts of side surfaces of the multi-layer substrate 15 to the bottom surface thereof, external terminals 19 is disposed. In addition, on the upper surface of the multi-layer substrate 15, as discreet components, capacitors C2 to C4 constituting the baluns 141 to 143 are mounted, and the whole structure is covered by a metal cap 20. The cap 20 is connected to the external terminals 19 by solders 21.

The LC filter 12, the baluns 141 to 143, and the SiIC 17 are connected by a via-hole electrode 22 and the like disposed inside the multi-layer substrate 15.

With the above arrangement, the receiving module 10 is integrated by the multi-layer substrate 15.

Figure 4:
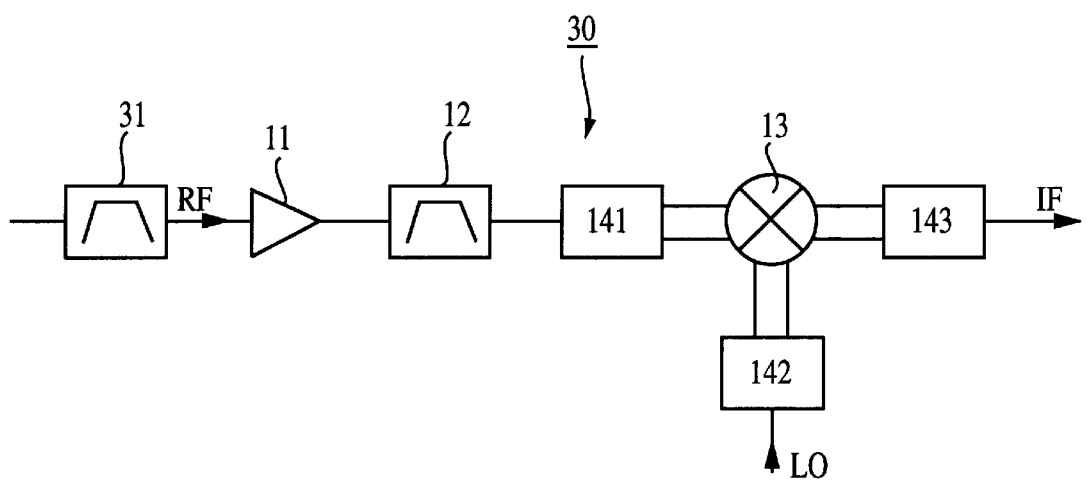
FIG. 4 is a block diagram of a receiving module according to a second embodiment of the present invention.

FIG. 4 is a block diagram of a receiving module according to a second embodiment of the present invention. Unlike the receiving module 10 according to the first embodiment shown in FIG. 1, a receiving module 30 includes a high frequency LC filter 31 disposed at the front stage of a low-noise amplifier 11, that is, on an antenna side.

In the receiving module 30 of the second embodiment, since the Gilbert-cell type mixer is used, sufficient isolation between the terminals of the mixer can be obtained. As a result, leakage of received signals from a received signal terminal to a local oscillation signal terminal can be suppressed. Thus, since it is not necessary to dispose a high frequency filter for eliminating received signals between the local oscillation signal terminal and the local oscillation circuit, the receiving module can be made compact.

Since sufficient isolation can be obtained between the terminals of the mixer, and the Gilbert-cell type mixer capable of canceling even-order harmonics is used, leakage of received signals from a received signal terminal to a local oscillation signal terminal can be suppressed, and occurrence of half-image signals can also be suppressed. Therefore, the high frequency filter disposed between the low-noise amplifier and the mixer does not have to attenuate local oscillation signals and half-image signals. It is only necessary for the high frequency filter to attenuate image signals. As a result, the characteristics of the high frequency filter can be relaxed, and with only a low-priced single filter having a broad band such as an LC filter, it is possible to provide the necessary functions of the receiving module. Thus, the production cost of the receiving module can be reduced.

In addition, since the low-noise amplifier and the Gilbert-cell type mixer constituting the receiving module are integrated in the multi-layer substrate formed by laminating the plurality of ceramic sheet layers, a matching circuit, which needs to be incorporated in the Gilbert-cell type mixer, can be contained in the multi-layer substrate. As a result, the number of components can be reduced, and the size of the receiving module can thereby be reduced.

In addition, when an LC filter is used as the high frequency filter, since the LC filter can be contained in the multi-layer substrate, the receiving module can be more miniaturized.

Figure 5:
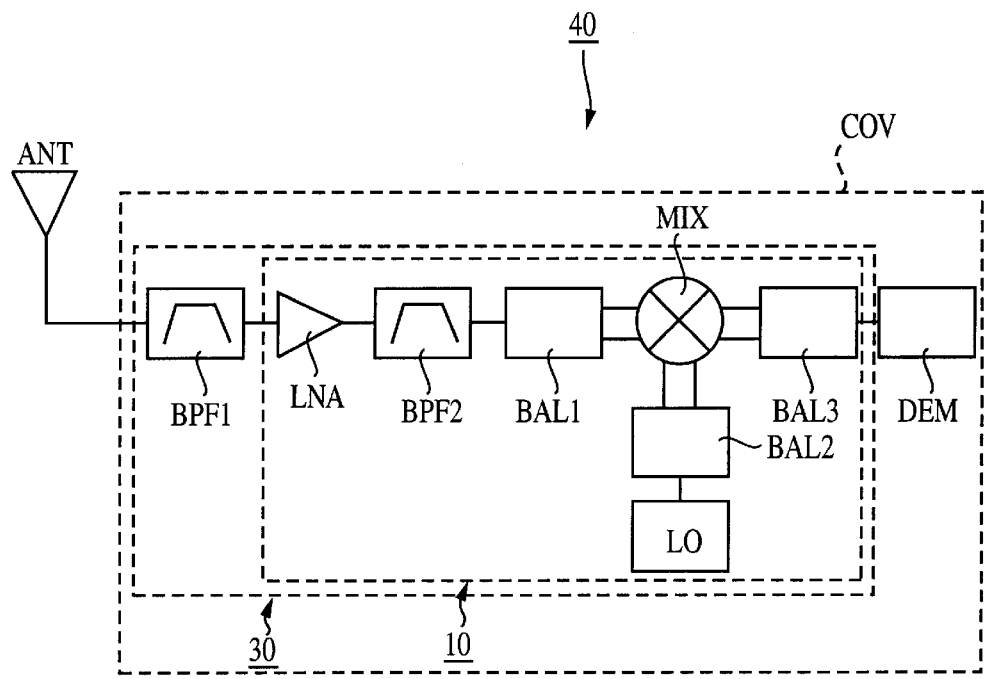
FIG. 5 is a block diagram of a receiver according to an embodiment of the present invention.
Figure 6:
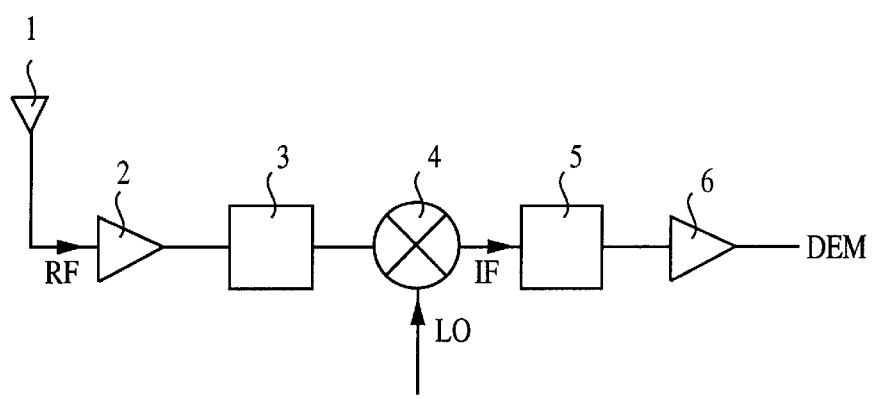
FIG. 6 is a block diagram of a conventional receiver.
Figure 7:
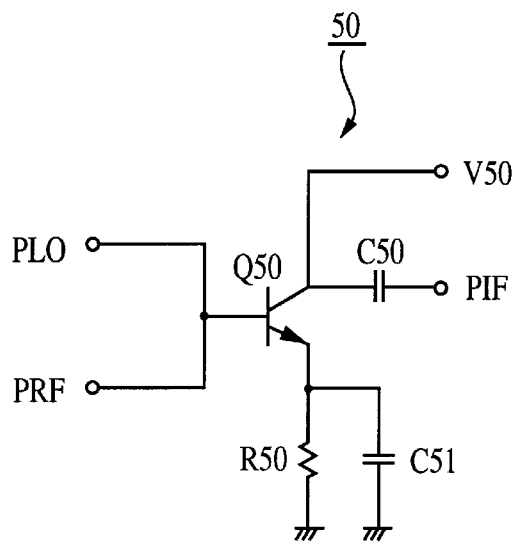
FIG. 7 is a circuit diagram of a single-end type mixer used in the conventional receiver.
Figure 8:
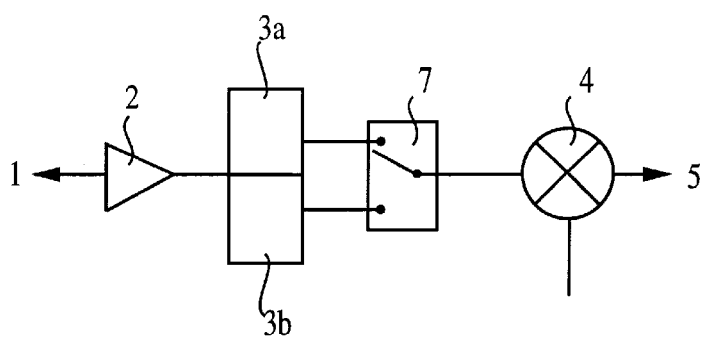
FIG. 8 is a block diagram showing a part of another conventional receiver.

FIG. 5 is a block diagram of a receiver according to an embodiment of the present invention. A receiver 40 includes an antenna ANT, band pass filters BPF1 and BPF2, a low-noise amplifier LNA, a mixer MIX, baluns BAL1 to BAL3, a local oscillator Lo, a demodulator DEM, and a cover COV covering the band pass filters BPF1 and BPF2, the low-noise amplifier LNA, the mixer MIX, the baluns BAL1 to BAL3, the local oscillator Lo, and the demodulator DEM.

The receiving module 10 shown in FIG. 1 is used as a module constituted of the band pass filter BPF2, the low-noise amplifier LNA, the mixer MIX, and the baluns BAL1 to BAL3. In addition, alternatively, the receiving module 30 shown in FIG. 4 is used as the module constituted of the band pass filters BPF1 and BPF2, the low-noise amplifier LNA, the mixer MIX, and the baluns BAL1 to BAL3.

In the receiver of the above embodiment, since the compact and low-priced received module is used, the receiver can be adapted to broadening of the bands of received signals and lowering of the frequencies of intermediate frequency signals, and miniaturization and cost reduction of the receiver can be easily made.

In each of the embodiments described above, the receiving module with one system for received signals has been described. However, the same advantages can be obtained in the case of a module with two or more systems for received signals, such as a dual-mode system or a triple-mode system.

In addition, although the LC filter is used as the high frequency filter in each of the above embodiments, the same advantages can be obtained even when either a surface acoustic wave filter or a dielectric filter is used.

In addition, although the high frequency filter used in each of the above embodiments is a band pass filter, the same advantages can be obtained even when either a low pass filter or a high pass filter is used.

Moreover, in the above embodiments, the sheet layers are formed of ceramic whose main components are barium oxide, aluminum oxide, and silica, any other material having a relative permittivity (Er) equal to or greater than 1 can be used. For example, a ceramic whose main components are magnesium oxide and silica can be used to obtain the same advantages.

Furthermore, in the above embodiments, although the capacitors constituting the baluns are mounted as discrete components on the upper surface of the multi-layer substrate, the capacitors can also be disposed inside the multi-layer substrate, like the inductors.

In addition, the low-noise amplifier and the Gilbert-cell type mixer are constituted by a SiIC in the above embodiments, they can be constituted by a GaAsIC, a SiGeIC, or the like.

In addition, the low-noise amplifier and the Gilbert-cell type mixer are integrated by a SiIC to be mounted in the cavity of the multi-layer substrate. However, these components can be separately mounted therein.

Moreover, the cavity of the multi-layer substrate in which the SiIC integrating the low-noise amplifier and the Gilbert-cell type mixer is mounted is sealed by resin. Alternatively, no sealing may be required, or the cavity may be sealed by a cover formed of metal or ceramic.

Additionally, although the cap is disposed over the upper surface of the multi-layer substrate in the above embodiments, the structure without any cap disposed may be also applicable.

As described above, in the receiving module of the present invention, the Gilbert-cell type mixer is used as the mixer, whereby sufficient isolation can be obtained between the terminals of the mixer. Accordingly, leakage of received signals from a received signal terminal to a local oscillation signal terminal can be suppressed. Thus, there is no need for a high frequency filter eliminating received signals disposed between the local oscillation signal terminal and the local oscillation circuit, so the receiving module can be compact.

Moreover, since the Gilbert-cell type mixer is capable of having sufficient isolation between the terminals of the mixer and canceling even-order harmonics, leakage of received signals from a received signal terminal to a local oscillation signal terminal can be suppressed, and occurrence of half-image signals can also be suppressed. Therefore, the high frequency filter disposed between the low-noise amplifier and the mixer does not have to attenuate local oscillation signals and half-image signals. It is only necessary for the high frequency filter to attenuate image signals. As a result, the filter characteristics of the high frequency filter can be relaxed, and it is only necessary to use a low-priced single filter having a broad band such as an LC filter. Thus, production cost of the receiving module can be reduced.

In the receiving module described above, since the low-noise amplifier and the Gilbert-cell mixer constituting the receiving module are integrated by the multi-layer substrate formed by laminating the plurality of ceramic sheet layers, a matching circuit, which needs to be incorporated in the Gilbert-cell mixer, can be contained in the multi-layer substrate. As a result, since the number of components can be reduced, the receiving module can be more compact.

The receiver according to the present invention incorporates the compact and low-priced receiving module. As a result, the receiver can be adapted to broadening of the bands of received signals and lowering of the frequencies of intermediate frequency signals. In addition, miniaturization and cost reduction of the receiver can be easily achieved.

While embodiments of the present invention have been described above, it is to be understood by those skilled in the art that changes and modifications may be made without departing from the scope and spirit of the invention.

What is claimed is:

1. A receiving module comprising:
   a multi-layer substrate including a plurality of layers laminated together, the multi-layer substrate including a low-noise amplifier, an LC filter, a balun and a mixer connected to each other in series;
   the low-noise amplifier amplifies a signal received by an antenna;
   the mixer mixes the amplified signal with a local oscillation sign and outputs an intermediate frequency signal;
   the mixer being a Gilbert-cell type mixer; and
   the LC filter includes an inductor and a capacitor, the inductor and the capacitor being disposed within the multi-layer substrate.

2. A receiver comprising:
   the receiving module according to claim 1;
   an antenna which supplies said received signal to said low-noise amplifier;
   a local oscillator which supplies said local oscillation signal to said mixer; and
   a demodulator which receives and demodulates said intermediate frequency signal from said mixer.

3. The receiving module according to claim 1, wherein the balun includes an inductor and a capacitor, and the inductor of the balun is provided within the multi-layer substrate.

4. The receiving module according to claim 3, wherein the inductor of the LC filter, the capacitor of the LC filter and the inductor of the balun are respectively provided on different layers of said plurality of layers of said multi-layer substrate.

5. The receiving module according to claim 3, wherein the inductor of the LC filter and the capacitor of the LC filter are disposed in a lower portion of the multi-layer substrate, and the inductor of the balun is disposed in an upper portion of the multi-layer substrate.

6. The receiving module according to claim 5, wherein the inductor of the LC filter is opposed to the inductor of the balun via the capacitor of the LC filter.

7. The receiving module according to claim 3, wherein the capacitor of the balun is mounted on an upper surface of the multi-layer substrate.

8. The receiving module according to claim 1, wherein the low-noise amplifier and the Gilbert-cell type mixer are integrated in a single integrated circuit.

9. The receiving module according to claim 8, wherein the multi-layer substrate includes a cavity, and the integrated circuit is disposed in the cavity.

10. The receiving module according to claim 9, wherein the cavity is provided on the lower surface of the multi-layer substrate.

11. The receiving module according to claim 1, wherein the balun is provided between the low-noise amplifier and the Gilbert-cell type mixer.

12. The receiving module according to claim 11, wherein the LC filter is provided between the low-noise amplifier and the balun.

* * * * *